(12) United States Patent
Sprouse et al.

(10) Patent No.: US 7,599,241 B2
(45) Date of Patent: Oct. 6, 2009

(54) ENHANCED WRITE ABORT MECHANISM FOR NON-VOLATILE MEMORY

(75) Inventors: Steven T. Sprouse, San Jose, CA (US); Dhaval Parikh, Santa Clara, CA (US); Arjun Kapoor, San Francisco, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/890,734

(22) Filed: Aug. 6, 2007

(65) Prior Publication Data

US 2009/0040843 A1 Feb. 12, 2009

(51) Int. Cl.
*G11C 5/14* (2006.01)
(52) U.S. Cl. .................. 365/228; 365/226; 365/229; 365/206
(58) Field of Classification Search .................. 365/228, 365/226, 229, 206
See application file for complete search history.

(56) References Cited

U.S. PATENT DOCUMENTS

| | | | | | |
|---|---|---|---|---|---|
| 4,521,847 | A | * | 6/1985 | Ziehm et al. .................. 700/79 |
| 4,580,039 | A | * | 4/1986 | Adams ...................... 235/30 R |
| 4,763,333 | A | * | 8/1988 | Byrd ........................... 714/22 |
| 4,843,592 | A | | 6/1989 | Tsuaki et al. |
| 4,931,993 | A | | 6/1990 | Urushima |
| 5,224,070 | A | | 6/1993 | Fandrich et al. |
| 5,237,699 | A | * | 8/1993 | Little et al. .................... 714/23 |
| 5,339,446 | A | | 8/1994 | Yamasaki et al. |
| 5,602,805 | A | | 2/1997 | Chigita |
| 5,715,464 | A | * | 2/1998 | Crump et al. ................ 713/323 |
| 5,742,787 | A | * | 4/1998 | Talreja ........................ 711/103 |
| 5,768,208 | A | * | 6/1998 | Bruwer et al. ................ 365/228 |
| 5,798,961 | A | * | 8/1998 | Heyden et al. ................ 365/52 |
| 5,832,281 | A | * | 11/1998 | Maeda ........................ 713/300 |
| 5,884,085 | A | | 3/1999 | Sakai et al. |
| 5,889,933 | A | * | 3/1999 | Smith .......................... 714/22 |
| 6,163,847 | A | * | 12/2000 | Yoon et al. .................. 713/320 |
| 6,169,944 | B1 | * | 1/2001 | Hayasaka .................... 701/36 |
| 6,226,556 | B1 | * | 5/2001 | Itkin et al. .................... 700/21 |

(Continued)

OTHER PUBLICATIONS

SiliconSystems, Inc., "Eliminating Drive Corruption From Power Disturbances, SiliconDrive PowerArmor Technology", Advanced Storage Technology, White Paper, Document: SSWP03-PowerArmor-R, 2007.

(Continued)

*Primary Examiner*—Viet Q Nguyen
(74) *Attorney, Agent, or Firm*—Brinks Hofer Gilson & Lione

(57) ABSTRACT

In a non-volatile memory (NVM) device having a controller and a non-volatile memory array controlled by the controller a voltage supervisor circuit monitors an output of a voltage supply powering the NVM device. The voltage supervisor circuit may be part of the NVM device or coupled to it. The voltage supervisor circuit is configured to assert a "low-voltage" signal responsive to detecting the output of the voltage supply powering the NVM device dropping below a predetermined value. The controller is configured to write data into the memory array while the "low-voltage" signal is deasserted and to suspend writing data while the "low-voltage" signal is asserted. In response to assertion of the "low-voltage" signal, the controller completes a write cycle/program operation, if pending, and prevents any additional write cycles/program operation(s) during assertion of the "low-voltage" signal.

35 Claims, 2 Drawing Sheets

U.S. PATENT DOCUMENTS

| | | | |
|---|---|---|---|
| 6,246,626 B1 * | 6/2001 | Roohparvar | 365/226 |
| 6,266,277 B1 | 7/2001 | Roohparvar | |
| 6,601,149 B1 | 7/2003 | Brock et al. | |
| 6,735,706 B2 | 5/2004 | Tomlinson et al. | |
| 6,766,394 B1 | 7/2004 | Shimura et al. | |
| 6,819,622 B2 | 11/2004 | Roohparvar et al. | |
| 6,842,801 B2 * | 1/2005 | Yamada | 710/56 |
| 6,856,556 B1 | 2/2005 | Hajeck | |
| 6,912,172 B2 | 6/2005 | Honma et al. | |
| 6,930,925 B2 * | 8/2005 | Guo et al. | 365/185.28 |
| 7,093,064 B2 * | 8/2006 | Dalvi et al. | 711/103 |
| 7,126,857 B2 | 10/2006 | Hajeck | |
| 7,139,937 B1 * | 11/2006 | Kilbourne et al. | 714/47 |
| 7,171,542 B1 | 1/2007 | Alfano et al. | |
| 7,203,886 B2 * | 4/2007 | Brown et al. | 714/758 |
| 7,321,977 B2 | 1/2008 | Kojima | |
| 7,415,621 B2 | 8/2008 | Odaohhara | |
| 7,423,451 B2 * | 9/2008 | Balasubramanian et al. | 326/38 |
| 7,430,089 B2 | 9/2008 | Suzuki et al. | |
| 2009/0040842 A1 | 2/2009 | Sprouse et al. | |

OTHER PUBLICATIONS

U.S. Appl. No. 11/890,708 entitled, "Enhanced Write Abort Mechanism for Non-Volatile Memory", filed Aug. 6, 2007.

International Search Report for counterpart application No. PCT/US2008/071865, dated Nov. 26, 2008, 3 pages.

International Written Opinion for counterpart application No. PCT/US2008/071865, dated Nov. 26, 2008, 4 pages.

* cited by examiner though in the name of inventors Steven T.

ENHANCED WRITE ABORT MECHANISM FOR NON-VOLATILE MEMORY

STATEMENT OF RELATED APPLICATIONS

The present application may be considered to be related to co-pending U.S. patent application Ser. No. 11/890,708 filed on even date herewith, in the name of inventors Steven T. Sprouse, Dhaval Parikh and Arjun Kapoor, entitled "Enhanced Write Abort Mechanism for Non-Volatile Memory", commonly owned herewith.

TECHNICAL FIELD

The present disclosure relates generally to write abort mechanisms for use with non-volatile memory.

BACKGROUND

Binary and Multi-Level Cell (MLC) NAND Flash Memory are forms of non-volatile memory (NVM) that are capable of high data storage densities and high performance, however, a power failure due to hot removal, brownout, blackout or the like can cause data corruption or loss due to the nature of the way in which data is written to this type of memory. Typically a "page" or group of bits at a time is written to the NVM. If a power failure occurs during a write cycle/program operation, something less than all of the bits of the page may be programmed successfully in the NVM. When the page containing unsuccessfully programmed bits is read back, some bits will have the new value, some will have the old value and, as a result, the page will be corrupted. In some prior approaches, complex data structures and multiple copies of host data are kept on the NVM device to ensure graceful recovery under most circumstances. This approach, unfortunately, reduces performance and data storage densities. An NVM program cycle using Flash-type memory, for example, typically takes on the order of 0.5-10 mSec, depending upon the type of memory.

This problem can be addressed through the use of a backup or secondary power source arranged to directly power the NVM such as a battery or very large-valued capacitor (on the order of 1000's of uF), but these solutions are often costly or require too much space. An improved solution would be desirable.

OVERVIEW

In a non-volatile memory (NVM) device having a controller and a non-volatile memory array controlled by the controller a voltage supervisor circuit monitors an output of a voltage supply powering the NVM device. The voltage supervisor circuit may be part of the NVM device or coupled to it. The voltage supervisor circuit is configured to assert a "low-voltage" signal responsive to detecting the output of the voltage supply powering the NVM device dropping below a predetermined value. The controller is configured to write data into the memory array while the "low-voltage" signal is deasserted and to suspend writing data while the "low-voltage" signal is asserted. In response to assertion of the "low-voltage" signal, the controller completes a write cycle/NVM program operation, if pending, and prevents any additional write cycles/program operation(s) during assertion of the "low-voltage" signal.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Figure 1:
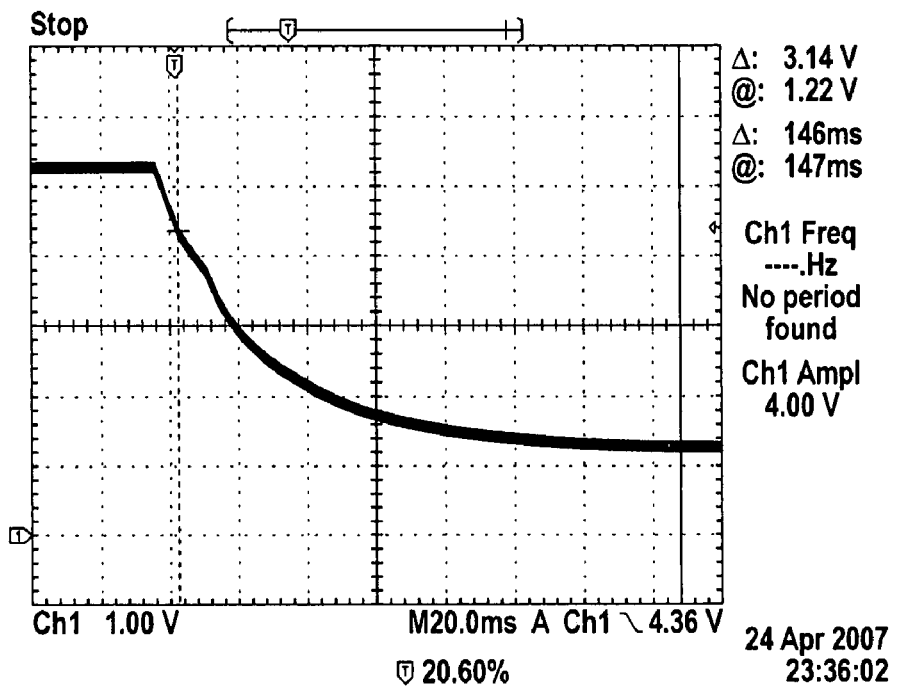
FIG. 1 is a voltage/time plot which illustrates graphically a power-off profile for one typical power supply from a personal computer.

Example embodiments are described herein in the context of a non-volatile memory device of the type having a controller controlling the reading and writing of data from/to an associated non-volatile memory array. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

In embedded applications of NVM, where hot removal is not a substantial issue (e.g., due to the memory device being relatively inaccessible, soldered in place, or the like) it is possible to leverage the inherent capacitance of the system (e.g., power supply capacitors and printed circuit board capacitance) to allow for successful completion of "pending" or in-process NVM program or write cycle.

Figure 2:
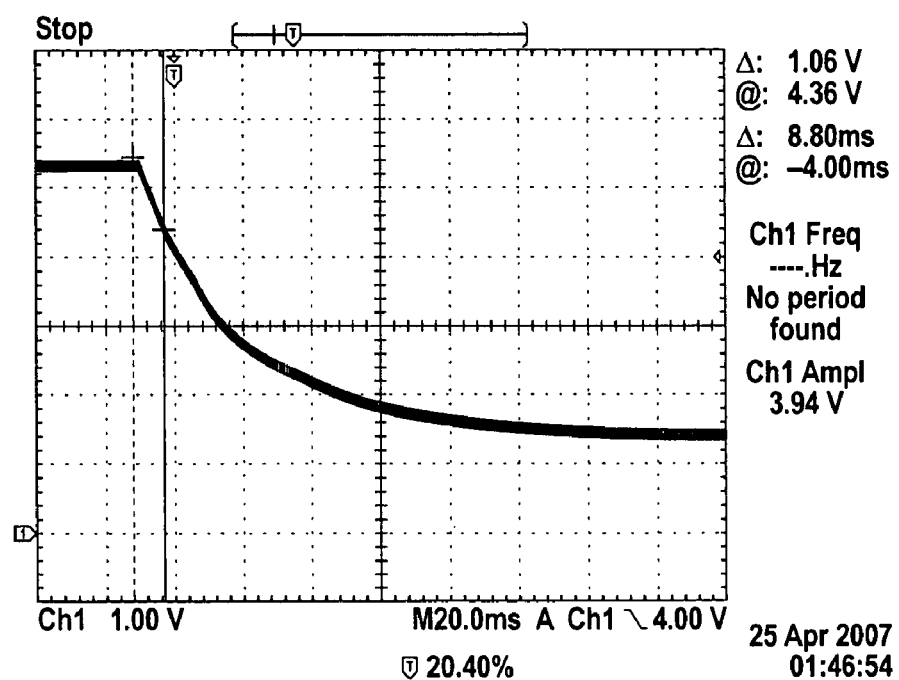
FIG. 2 is a similar voltage/time plot which illustrates graphically a power-off profile for another typical power supply from a personal computer.

Turning to FIGS. 1 and 2, FIG. 1 is a voltage/time plot which graphically illustrates a power-off profile for one typical power supply from a personal computer. FIG. 2 is a similar voltage/time plot which graphically illustrates a power-off profile for another typical power supply from a personal computer. In each case, the vertical scales are 1 Volt DC (VDC) per division and the horizontal scales are 20 mSec per division. Of interest is the fact that upon being turned off, the power supply is able to hold the voltage for almost two divisions, then the voltage starts to drop. The voltage spends approximately 25 mSec in the voltage range between 4.5 VDC and 2.7 VDC. In one embodiment it is expected that NVM should be able to complete a write cycle/program operation in approximately 0.5-5 mSec, thus if the memory were to complete a current write cycle/program operation and begin no other write cycles/program operation(s) while the power was interrupted, data corruption problems could be obviated in such applications of NVM.

Figure 3:
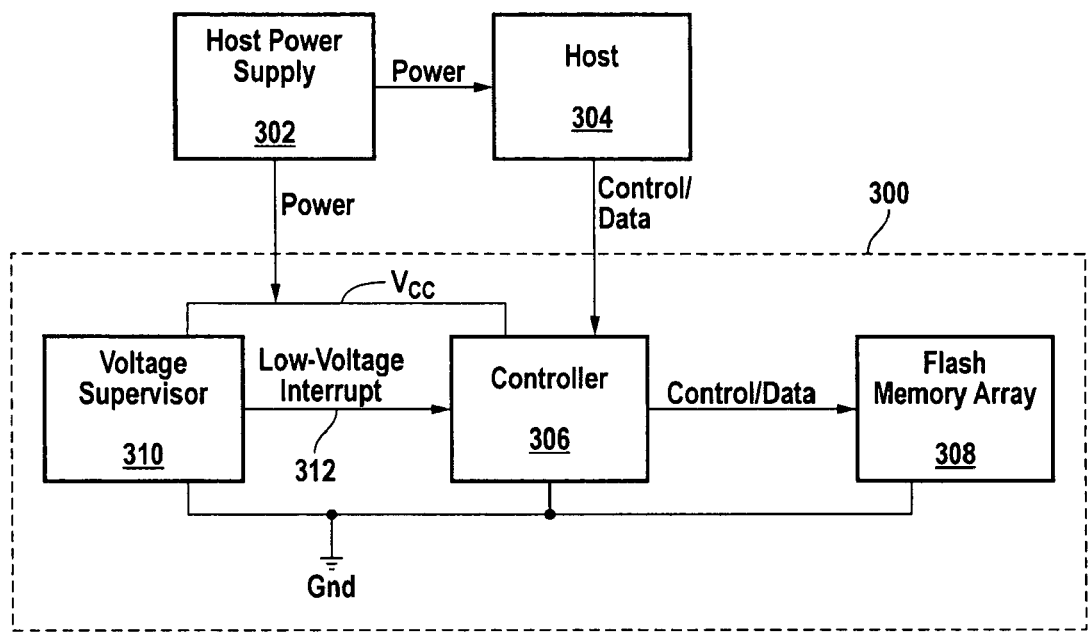
FIG. 3 illustrates a schematic block diagram of a non-volatile (NVM) memory device coupled to a host in accordance with one embodiment.
Figure 4:
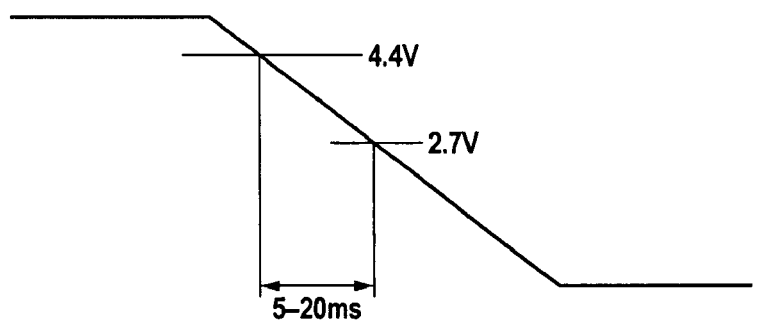
FIG. 4 illustrates an ideal voltage/time plot and the time available for completing a pending write operation in accordance with one embodiment.

To utilize this feature of large power supplies, a voltage supervisor circuit 304, as shown in FIG. 3, is used to detect when the voltage has dropped significantly—here to a predetermined level of below 4.5 VDC (from just above 5.0 VDC). At that point, the voltage supervisor circuit is configured to assert a "low voltage signal" indicative of the below normal voltage output of the power supply to alert the NVM controller to suspend further writes to the NVM memory array. This approach takes full advantage of the fact that even though the specified Vcc_min is 4.5 VDC, the controller and memory will continue to function (in one embodiment) until the voltage drops to approximately 2.7 VDC. If the ramp down rate is sufficiently low, as shown in FIG. 4, e.g., 4.4 VDC to 2.7 VDC in about 5-20 mSec in one embodiment, then there will be enough time to complete a pending write cycle/program operation and further write cycles/program operation(s) will be suspended while the "low-voltage" signal continues to be asserted by the voltage supervisor circuit 304. Implementation of the voltage supervisor circuit 304 may be made in any convenient manner known to those of skill in the art.

In FIG. 3 a system bock diagram illustrates a configuration of an NVM device 300 coupled to a host power supply 302 and a host device 304. The host power supply 302 and host device 304 are of conventional design. The NVM device 300 comprises a non-volatile memory controller 306, flash memory array 308 and voltage supervisor circuit 310. Upon detecting an output voltage of the power supply (Vcc-GND) lower than a predetermined value (here we use the example 4.4 VDC in a 5 VDC system), the voltage supervisor circuit 310 in one embodiment asserts a "low-voltage" signal or "interrupt" on line 312. The controller 306, responsive to the assertion of this signal, completes any pending (e.g., already started) write cycles/NVM program operation and then (in one embodiment) executes a repetitive algorithm or loop to repetitively check to see if the low-voltage signal has been deasserted, as would occur if a blackout/brownout resolved itself before causing a complete power shutdown. The result of running this repetitive algorithm is to lock up the controller 306 so that no further write cycles/program operation(s) may be started (without causing it to reset). Of course, if the power is not restored, the controller 306 will eventually reset due to lack of power, but because many power glitches are quickly resolved, this approach protects the memory contents while avoiding unnecessary resets. In another embodiment, the "low-voltage" signal is applied as a standard flash memory control signal known as the "ready/busy" or "rb" signal. In accordance with this approach, if the voltage supervisor 310 were to detect a low-voltage condition and thus assert this signal, the flash memory array 308 would complete any pending write cycles/program operation(s), and internally it would deassert its "ready/busy" line to signal to the controller 306 that it was ready to execute another command (e.g., another write). However, the voltage supervisor 310, by asserting "ready/busy" to the controller 306, can, in effect, override the signal from the flash memory array 308 and thereby prevent the memory from effectively signaling that it is ready. In this way controller 306 is tricked into concluding that the memory is still busy (i.e., until the voltage supervisor 310 deasserts "ready/busy" to the controller 306).

In accordance with various embodiments, the voltage supervisor circuit 304 may be external to a package (such as, for example, a multi-chip module or other packaging technology supporting and interconnecting multiple circuit components) or die (i.e., a die from a semiconductor wafer) comprising the flash memory array 308 and controller 306 (the package or die receiving the low-voltage signal via an electrical coupling to the external voltage supervisor 310), or the voltage supervisor circuit 310 may be integrated into a package or die comprising the flash memory array 308 and controller 306, the voltage supervisor circuit 310 implemented as a part of the package or die itself, receiving the +Vcc and GND power signals from a power supply which is external to the package or die (e.g., from a host power supply 302). Similarly, the flash memory array 308 and the voltage supervisor 310 may be integrated together into a single package or die and coupled to an external controller 306. In such an implementation, a low-voltage condition is detected at the package/die comprising the array/voltage supervisor and the voltage supervisor signals back to the external controller 306. It is also contemplated that the controller 306 and voltage supervisor 310 may be integrated together in a single package/die apart from the flash memory array 308.

Note that in the implementation shown in FIG. 3, power line Vcc is not provided directly to flash memory array 308 but power provided to the flash memory array 308 is provided from controller 306 through the control/data line coupling controller 306 to flash memory array 308.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A method for carrying out a write-abort process to suspend attempts by a memory controller to write data into a non-volatile memory array during low-voltage conditions, the method comprising:

monitoring an output of a voltage supply powering the memory array with a voltage supervisor circuit;

detecting a "low-voltage" condition of the voltage supply and, responsive thereto, asserting a "low-voltage" signal;

subsequent to assertion of the "low-voltage" signal, completing any write cycle already started prior to assertion of the "low-voltage" condition signal using remaining power from the voltage supply; and suspending any unprocessed write commands while the "low-voltage" signal is asserted by causing the controller to repetitively execute an algorithm to check for deassertion of the "low-voltage" signal and to continue executing the algorithm until the low-voltage signal is deasserted.

2. A method for carrying out a write-abort process to suspend attempts by a memory controller to write data into a non-volatile memory array of a memory device during low-voltage conditions, the method comprising:

monitoring an output of a voltage supply powering the memory device with a voltage supervisor circuit;

detecting a "low-voltage" condition of the voltage supply and, responsive thereto, asserting a "low-voltage" signal on a ready/busy signal line of the memory controller;

subsequent to assertion of the "low-voltage" signal, completing any write cycle already started prior to assertion of the "low-voltage" condition signal using remaining power from the voltage supply; and suspending any unprocessed write commands while the "low-voltage" signal is asserted on the ready/busy signal line by causing the controller to treat the memory array as "busy" in response to assertion of the "low-voltage" signal on the ready/busy signal line of the memory controller and to continue treating the memory array as busy until the low-voltage signal is deasserted.

3. A method for carrying out a write-abort process to suspend attempts by a memory controller to write data into a non-volatile memory array during low-voltage conditions, the method comprising:

monitoring an output of a voltage supply powering the non-volatile memory array;

determining if a low-voltage condition exists at the output of the voltage supply;

subsequent to determining that the low-voltage condition exits, completing any write cycle already started prior to detection of the low-voltage condition using remaining power from the voltage supply; and suspending any unprocessed write commands while the low-voltage condition exists.

4. The method of claim 3, wherein monitoring the output of the voltage supply comprises monitoring the output of the voltage supply with a voltage supervisor circuit.

5. The method of claim 3, wherein determining if the low-voltage condition exists comprises:

detecting for the low-voltage condition at the output of the voltage supply with a voltage supervisor circuit and, if the low-voltage condition is detected, asserting a low-voltage condition signal.

6. The method of claim 5, wherein suspending any unprocessed write commands comprises the memory controller repetitively executing an algorithm to check for deassertion of the low-voltage condition signal until the low-voltage condition signal is deasserted.

7. The method of claim 4, wherein determining if the low voltage condition exists comprises detecting the low-voltage condition of the voltage supply with the voltage supervisor circuit and, responsive thereto, asserting a low-voltage condition signal on a ready/busy signal line of the memory controller.

8. The method of claim 7, wherein suspending any unprocessed write commands while the low-voltage condition exists comprises:

suspending any unprocessed write commands while the low-voltage condition signal is asserted on the ready/busy signal line by causing the controller to treat the non-volatile memory array as busy in response to assertion of the low-voltage condition signal on the ready/busy signal line of the memory controller and to continue treating the non-volatile memory array as busy until the low-voltage condition signal is deasserted.

9. A non-volatile memory apparatus, comprising:

a non-volatile memory array;

a voltage supervisor circuit configured for monitoring an output of a voltage supply powering the apparatus, the voltage supervisor circuit configured to assert a "low-voltage" signal responsive to detecting the output of the voltage supply dropping below a predetermined value; and a memory controller in communication with the memory array and configured to, subsequent to assertion of the "low-voltage" signal, complete any write cycle already started prior to assertion of the "low-voltage" signal using remaining power from the voltage supply and to suspend writing data for any subsequent write cycles while the "low-voltage" signal remains asserted.

10. The apparatus of claim 9, wherein the non-volatile memory array, memory controller and voltage supervisor circuit are integrated into a single package.

11. The apparatus of claim 9, wherein the non-volatile memory array, memory controller and voltage supervisor circuit are integrated into a single die.

12. The apparatus of claim 9, wherein the non-volatile memory array and memory controller are integrated into a single package and the voltage supervisor circuit is external to that package.

13. The apparatus of claim 9, wherein the non-volatile memory array and memory controller are integrated into a single die and the voltage supervisor circuit is external to that die.

14. The apparatus of claim 9, wherein the non-volatile memory array and the voltage supervisor circuit are integrated into a single package and the memory controller is external to that package.

15. The apparatus of claim 9, wherein the non-volatile memory array and the voltage supervisor circuit are integrated into a single die and the memory controller is external to that die.

16. The apparatus of claim 9, wherein the voltage supervisor circuit and the memory controller are integrated into a single package and the non-volatile memory array is external to that package.

17. The memory system of claim 9, wherein the voltage supervisor circuit and the memory controller are integrated into a single die and the non-volatile memory array is external to that die.

18. The apparatus of claim 9, wherein the controller is configured to suspend writing data in response to the execution of a repetitive algorithm which includes checking the status of the "low-voltage" signal until the "low-voltage" signal is deasserted.

19. The apparatus of claim 10, wherein the controller is configured to suspend writing data in response to the execution of a repetitive algorithm which includes checking the status of the "low-voltage" signal until the "low-voltage" signal is deasserted.

20. The apparatus of claim 11, wherein the controller is configured to suspend writing data in response to the execution of a repetitive algorithm which includes checking the status of the "low-voltage" signal until the "low-voltage" signal is deasserted.

21. The apparatus of claim 12, wherein the controller is configured to suspend writing data in response to the execution of a repetitive algorithm which includes checking the status of the "low-voltage" signal until the "low-voltage" signal is deasserted.

22. The apparatus of claim 13, wherein the controller is configured to suspend writing data in response to the execution of a repetitive algorithm which includes checking the status of the "low-voltage" signal until the "low-voltage" signal is deasserted.

23. The apparatus of claim 14, wherein the controller is configured to suspend writing data in response to the execution of a repetitive algorithm which includes checking the status of the "low-voltage" signal until the "low-voltage" signal is deasserted.

24. The apparatus of claim 15, wherein the controller is configured to suspend writing data in response to the execution of a repetitive algorithm which includes checking the status of the "low-voltage" signal until the "low-voltage" signal is deasserted.

25. The apparatus of claim 16, wherein the controller is configured to suspend writing data in response to the execution of a repetitive algorithm which includes checking the status of the "low-voltage" signal until the "low-voltage" signal is deasserted.

26. The apparatus of claim 17, wherein the controller is configured to suspend writing data in response to the execution of a repetitive algorithm which includes checking the status of the "low-voltage" signal until the "low-voltage" signal is deasserted.

27. The apparatus of claim 9, wherein the controller is configured to suspend writing data in response to the assertion of the "low-voltage" signal on a ready/busy signal line of the controller until the "low-voltage" signal is deasserted.

28. The apparatus of claim 10, wherein the controller is configured to suspend writing data in response to the assertion of the "low-voltage" signal on a ready/busy signal line of the controller until the "low-voltage" signal is deasserted.

29. The apparatus of claim 11, wherein the controller is configured to suspend writing data in response to the assertion of the "low-voltage" signal on a ready/busy signal line of the controller until the "low-voltage" signal is deasserted.

30. The apparatus of claim 12, wherein the controller is configured to suspend writing data in response to the assertion of the "low-voltage" signal on a ready/busy signal line of the controller until the "low-voltage" signal is deasserted.

31. The apparatus of claim 13, wherein the controller is configured to suspend writing data in response to the assertion of the "low-voltage" signal on a ready/busy signal line of the controller until the "low-voltage" signal is deasserted.

32. The apparatus of claim 14, wherein the controller is configured to suspend writing data in response to the assertion of the "low-voltage" signal on a ready/busy signal line of the controller until the "low-voltage" signal is deasserted.

33. The apparatus of claim 15, wherein the controller is configured to suspend writing data in response to the assertion of the "low-voltage" signal on a ready/busy signal line of the controller until the "low-voltage" signal is deasserted.

34. The apparatus of claim 16, wherein the controller is configured to suspend writing data in response to the assertion of the "low-voltage" signal on a ready/busy signal line of the controller until the "low-voltage" signal is deasserted.

35. The apparatus of claim 17, wherein the controller is configured to suspend writing data in response to the assertion of the "low-voltage" signal on a ready/busy signal line of the controller until the "low-voltage" signal is deasserted.

* * * * *